United States Patent [19]
Yasumura et al.

[11] Patent Number: 5,458,497
[45] Date of Patent: Oct. 17, 1995

[54] CONNECTOR ASSEMBLY

[75] Inventors: Gary Yasumura, Santa Clara; Wayne McNinch, Sunnyvale; Michael D. Perry, Woodside; Russell G. Larsen, San Jose, all of Calif.

[73] Assignee: Beta Phase, Inc., Menlo Park, Calif.

[21] Appl. No.: 67,875

[22] Filed: May 27, 1993

[51] Int. Cl.⁶ .................. H01R 13/629; H01R 23/68
[52] U.S. Cl. ................. 439/62; 439/341; 439/376
[58] Field of Search ....................... 439/341, 376, 439/377, 924, 326, 62, 67, 680, 681

[56] References Cited

U.S. PATENT DOCUMENTS

| | | | |
|---|---|---|---|
| 4,307,927 | 12/1981 | Mollman | 439/681 |
| 4,503,608 | 3/1985 | Evans | 439/924 |
| 4,960,387 | 10/1990 | Davis et al. | 439/374 |
| 5,145,398 | 9/1992 | Manabe | 439/341 |
| 5,195,897 | 3/1993 | Kent et al. | 439/67 |
| 5,211,568 | 5/1993 | Yamada et al. | 439/157 |
| 5,256,078 | 10/1993 | Lwee et al. | 439/326 |

FOREIGN PATENT DOCUMENTS

| | | |
|---|---|---|
| 0419818 | 4/1991 | European Pat. Off. . |
| 0485131 | 5/1992 | European Pat. Off. . |

*Primary Examiner*—Gary F. Paumen
*Attorney, Agent, or Firm*—Burns, Doane, Swecker & Mathis

[57] ABSTRACT

A connector assembly for a electrically interconnecting two printed circuit board like members comprises a connector member for being mounted on a first printed circuit board like member. The connector member includes generally parallel-spaced electrical conductors for being electrically connected to electrical circuitry positioned on the first printed circuit board like member when the connector member is mounted on the first printed circuit board like member. The electrical conductors are positioned along at least one side of an opening which extends along the connector member and which is adapted to receive a second printed circuit board like member having electrical circuitry thereon. The connector member and/or the second printed circuit board like member are configured in such a way that the second printed circuit board like member can be rotated relative to the connector member during insertion into and withdrawal from the opening in the connector member without breaking or otherwise damaging the connector member or the second printed circuit board like member. In accordance with one embodiment of the invention, an alignment block is mounted on the connector member and is positionable in a slot in the second printed circuit board like member upon insertion of the second printed circuit board like member into the opening in the connector member.

24 Claims, 6 Drawing Sheets

FIG. 1

PRIOR ART

FIG. 2

PRIOR ART

CONNECTOR ASSEMBLY

BACKGROUND OF THE INVENTION

1. Field of the Invention

The invention relates to connector assemblies and more particularly to connector assemblies that are used to provide electrical connection between two printed circuit boards or the like.

2. Related Art

Figure 1:
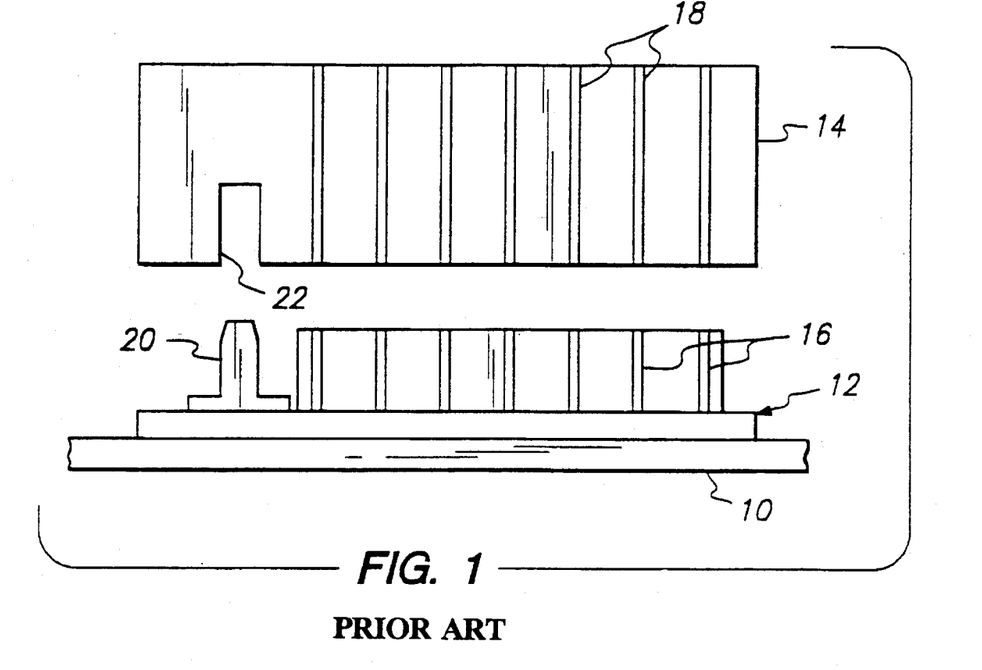
FIG. 1 is a plan view illustrating a known plug-in printed circuit board being inserted into an electrical connector that is mounted on a motherboard.

Printed circuit boards and the like are oftentimes provided with an arrangement that allows another circuit board or the like to be electrically connected thereto. For example, a motherboard can be outfitted to allow a daughterboard or plug-in board to be electrically connected thereto. FIG. 1 illustrates a known type of arrangement for electrically interconnecting one printed circuit board with another printed circuit board.

As seen in FIG. 1, an existing printed circuit board 10 (e.g., a motherboard or back plane board) has a connector element 12 mounted thereon. The connector element 12 is provided with electrical contacts 16 that are electrically connected to electrical circuitry on the motherboard 10. Although not seen in FIG. 1, an opening extends along the length of the connector element 12 for receiving another printed circuit board 14 (e.g., a daughterboard or plug-in board). When the printed circuit board 14 is inserted into the opening in the connector element 12, the electrical circuitry 18 on the plug-in board 14 will be electrically connected to the electrical contacts on the connector element 12. In that way, the electrical circuitry on the two printed circuit boards 10, 14 can be electrically interconnected.

When mounting the plug-in board 14 on the connector element 12, it is important that the electrical circuitry 18 on the plug-in board 14 be properly aligned with the electrical contacts 16 on the connector element 12. To help ensure proper alignment, the connector element 12 is typically provided with an alignment blade 20 that is adapted to fit into a slot 22 formed in the plug-in board 14. The alignment blade 20 is positioned relative to the electrical contacts 16 on the connector element 12 in the same manner as the slot 22 is positioned relative to the electrical circuitry 18 on the plug-in board 14. As a result, when the plug-in board 14 is mounted on the electrical connector 12 with the alignment blade 20 positioned within the slot 22, the electrical circuitry 18 on the plug-in board 14 will be accurately aligned with the electrical contacts 16 on the connector element 12.

Figure 2:
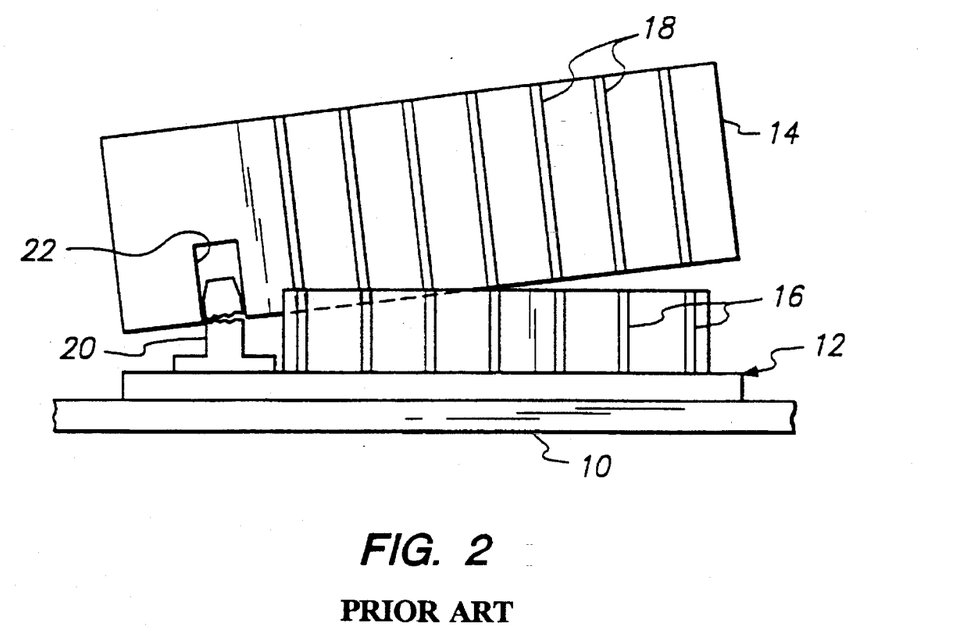
FIG. 2 is a view similar to FIG. 1 illustrating the breakage of the alignment blade that occurs when the plug-in printed circuit board shown in FIG. 1 is pivoted or rotated relative to the electrical connector.

The connector element 12 shown in FIG. 1 is, however, susceptible of certain improvements. As can be readily appreciated, in order for the cooperating alignment blade 20 and slot 22 to properly align the electrical circuitry 18 on the plug-in board 14 with the electrical contacts 16 on the connector element 12, the alignment blade 20 must be configured to closely fit within the slot 22 in order to prevent play between the alignment blade 20 and the slot 22. It has been found that during insertion of the plug-in board 14 into the opening in the connector element 12 and or during withdrawal of the plug-in board 14 from the opening in the connector element 12, there is a tendency to rotate or pivot the plug-in board 14 relative to the connector element 12. That tendency is due at least in part to the fact that the width of the opening in the connector element 12 which receives the plug-in board 14 is typically about the same as or slightly less than the thickness of the plug-in board 14. Thus, it is oftentimes easier to initiate insertion of the plug-in board 14 into the opening in the connector element 12 or withdrawal of the plug-in board 14 from the opening by pivoting or rotating the plug-in board 14 relative to the connector element 12. However, because of the close tolerances between the alignment blade 20 and the slot 22 in the plug-in board 14, the rotation of the plug-in board 14 relative to the connector element 12 results in the application of a torque force to the alignment blade 20. If the torque force is excessive, the alignment blade 20 can become broken or otherwise damaged as illustrated in FIG. 2.

It would be highly desirable, therefore, to provide a connector element for electrically interconnecting two printed circuit board like members that is not susceptible to the same drawbacks mentioned above. In particular, it would be quite advantageous to provide a connector element having an alignment member that is configured to avoid creation of potentially damaging torque forces on the alignment member when a printed circuit board like member is rotated relative to the connector element during insertion and withdrawal of the printed circuit board like member into and from the connector element.

SUMMARY OF THE INVENTION

In accordance with one aspect of the present invention, a connector assembly is provided for electrically interconnecting two printed circuit board like members. The connector assembly comprises a connector member for being mounted on a first printed circuit board like member. The connector member includes generally parallel-spaced electrical conductors for being electrically connected to electrical circuitry on the first printed circuit board like member when the connector member is mounted on the first printed circuit board like member. The connector member also includes a longitudinal opening that extends along the length thereof for receiving a second printed circuit board like member. The electrical conductors extend along at least one side of the opening to make electrical contact with electrical circuitry on the second printed circuit board like member when the second printed circuit board like member is inserted into the opening in the connector member. The connector member is also provided with an alignment block that is located at one end of the opening for aligning electrical circuitry on the second printed circuit board like member with the electrical conductors that are positioned on the at least one side of the opening when the second printed circuit board like member is inserted into the opening. The alignment block is receivable in a slot provided in the second printed circuit board like member. The alignment block has oppositely positioned curved side surface portions and an end surface that extends between the side surface portions for allowing the second printed circuit board like member to pivot or rotate relative to the connector assembly without breaking or otherwise damaging the alignment block during insertion and withdrawal of the second printed circuit board like member into and from the opening. The curved side surface portions each have a radius of curvature as measured from a center of curvature. The perpendicular distance from the center of curvature of each curved side surface portion to the end surface is preferably less than the radius of a curvature of each of the curved side surface portions.

According to another aspect of the present invention, a connector assembly for electrically interconnecting two printed circuit board like members includes a connector member for being mounted on a first printed circuit board like member. The connector member includes generally parallel-spaced electrical conductors for being electrically connected to electrical circuitry on the first printed circuit board like member when the connector member is mounted on the first printed circuit board like member. The electrical conductors are positioned on at least one side of an opening that extends along a longitudinal extent of the connector element so that when a second printed circuit board like member having electrical circuitry thereon is inserted into the opening the electrical conductors on the at least one side of the opening are brought into electrical contact with the electrical circuitry on the second printed circuit board like member. Alignment means is also provided for aligning the electrical conductors on the at least one side of the opening with the electrical circuitry on the second printed circuit board like member when the second printed circuit board like member is inserted into the opening. Also, rotation allowing means is provided for allowing relative rotational movement between the second printed circuit board like member and the connector member during removal of the second printed circuit board like member from the opening without breaking or otherwise damaging the alignment means. The rotation allowing means permits relative rotational movement between the second printed circuit board like member and the connector member until the second printed circuit board like member is separated from the connector member.

In accordance with another aspect of the present invention, a printed circuit board like system for being electrically interconnected to a first printed circuit board like member includes a second printed circuit board like member having electrical circuitry thereon and a connector member for being mounted on a first printed circuit board like member. The connector member includes spaced-generally parallel electrical conductors for being electrically connected to electrical circuitry on the first printed circuit board like member when the connector member is mounted on the first printed circuit board like member. The electrical conductors are positioned on at least one side of an opening that extends along a longitudinal extent of the connector member for receiving the second printed circuit board like member. Alignment means are also provided for aligning the electrical conductors on the at least one side of the opening with electrical circuitry on the second printed circuit board like member when the second printed circuit board like member is inserted into the opening in the connector member. Additionally, rotation permitting means is included for permitting the second printed circuit board like member to be rotated relative to the connector member during insertion and withdrawal of the second printed circuit board like member into and from the connector member without creating torque forces sufficient to break the alignment means.

According to a still further aspect of the present invention, a connector assembly for electrically connecting a first printed circuit board like member to a second printed circuit board like member comprises a connector member for being mounted on a first printed circuit board like member. The connector member includes generally parallel-spaced electrical conductors for being electrically connected to electrical circuitry on the first printed circuit board like member when the connector member is mounted on the first printed circuit board like member. The connector member is also provided with a longitudinally extending opening for receiving a second printed circuit board like member, with the electrical conductors being positioned on at least one side of the opening. The assembly also includes alignment and rotation permitting means for aligning the electrical conductor on the connecting member with the electrical circuitry on the second printed circuit board like member when the second printed circuit board like member is inserted into the opening in the connector member and for allowing the second printed circuit board like member to be rotated relative to the connector member during insertion and withdrawal of the second printed circuit board like member into and from the opening in the connector member. The alignment and rotation permitting means including a slot provided on the connector member which extends transverse to the opening in the connector member.

BRIEF DESCRIPTION OF THE DRAWING FIGURES

Further details associated with the foregoing aspects of the invention will become more apparent from the description below, considered in conjunction with the accompanying drawing figures in which like elements bear like reference numerals, and wherein.

DETAILED DESCRIPTION OF THE PREFERRED EMBODIMENTS

Figure 3:
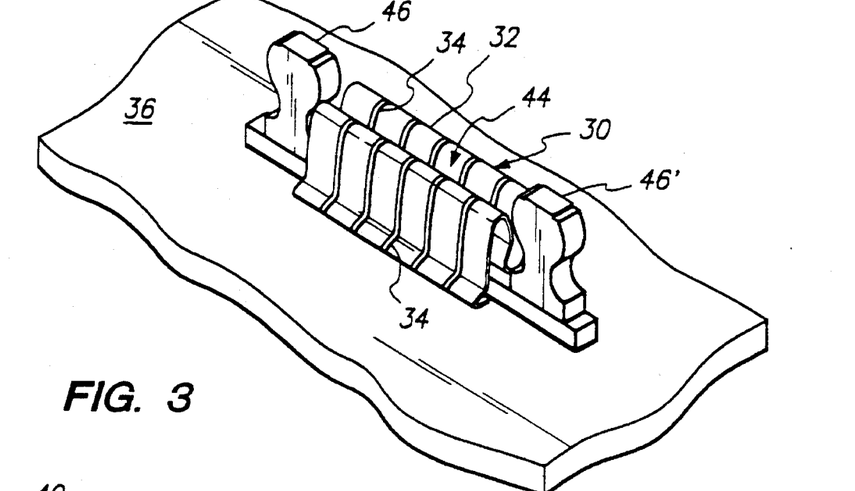
FIG. 3 is a perspective view of a connector assembly according to the present invention, including the alignment block.

With reference initially to FIG. 3, the connector assembly 30 of the present invention comprises a connector member 32 that is provided with spaced-generally parallel electrical conductors 34. The connector member 32 is adapted to be mounted on a printed circuit board like member 36, such as a motherboard or a back plane board, in a known manner in order to provide electrical connection between the electrical conductors 34 of the connector member 32 and the electrical circuitry (not shown) on the printed circuit board like member 36.

Figure 4:
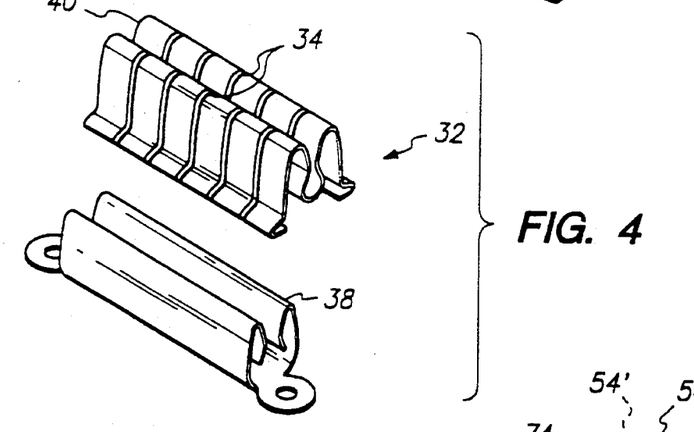
FIG. 4 is an exploded view of one embodiment of a connector member that forms a part of the connector assembly of the present invention.

The connector member 32 can take various forms, one of which is illustrated in the exploded view of FIG. 4. As seen, the connector member 32 can include a biasing member 38 on which is mounted flexible circuitry 40. The biasing member 38 can be fabricated from any resilient, spring-like material, such as beryllium copper. As seen in the cross-sectional view of FIG. 5, the biasing member 38 is generally C-shaped with arms 42 that are adapted to provide a biasing force towards one another when a printed circuit board like member is inserted therebetween. The flexible circuitry 40 includes the generally parallel-spaced electrical conductors 34.

Further details associated with the use of a connector member comprised of a combination of flexible circuitry and a biasing member are described in U.S. Pat. No. 5,195,897, the disclosure of which is incorporated herein by reference.

Figure 5:
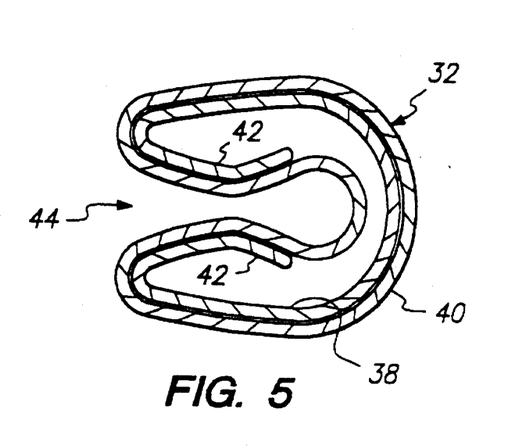
FIG. 5 is a cross-sectional view of the connector member shown in FIG. 4.

As further illustrated in FIG. 5, the connector member 32 is provided with a longitudinally extending opening 44 into which a printed circuit board like member can be inserted. The electrical conductors on the flexible circuitry 40 are positioned on opposite sides of the opening 44 so that electrical circuitry on opposite sides of a printed circuit board like member can be brought into electrical contact with the electrical conductors 34 on the flexible circuitry 40 when the printed circuit board like member is inserted into the opening 44 in the connector member 32.

Although the connector member 32 has been described above as being comprised of flexible circuitry 40 mounted on a biasing member 38, it is to be understood that the connector member could take other forms, such as those known in the art. Thus, the features illustrated in FIGS. 4 and 5 are merely intended to be illustrative for purposes of setting forth one example of the connector member 32.

With reference once again to FIG. 3, an alignment block 46 is mounted at one end of the longitudinally extending opening 44. Generally speaking, the alignment block 46 serves a function similar to that provided by the alignment blade 20 illustrated in FIG. 1. That is, the alignment block 46 is adapted to be received in a slot provided in a printed circuit board like member in order to accurately align the electrical circuitry on the printed circuit board like member with the electrical conductors 34 on the connector member 32 upon insertion of the printed circuit board like member into the longitudinal opening 44 in the connector member 32.

Figure 7:
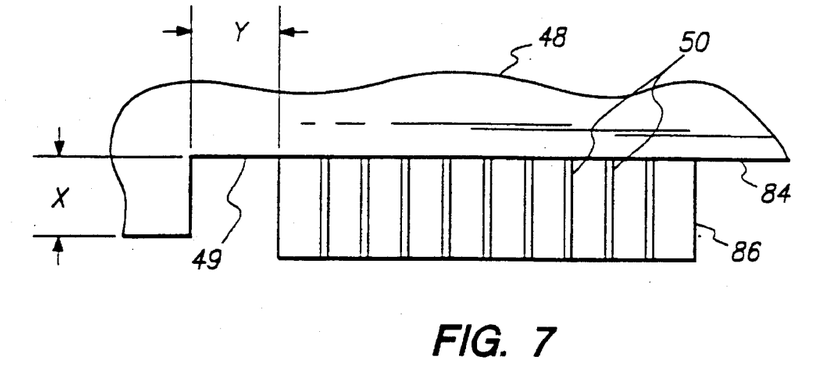
FIG. 7 is a plan view of a printed circuit board like member that can be used in connection with the connector assembly of the present invention.

For example, FIG. 7 illustrates a configuration of a printed circuit board like member that can be used in connection with the connector assembly 30 of the present invention. The printed circuit board like member 48 has electrical circuitry 50 disposed thereon and is provided with a slot 49 for receiving the alignment block 46. The alignment block 46 is positioned relative to the electrical conductors 34 on the connector member 32 in the same manner as the slot 49 in the printed circuit board like member 48 is positioned with respect to the electrical circuitry 50. In that way, when the printed circuit board like member 48 is inserted into the opening 44 in the connector member 32, the alignment block 46 will be received in the slot 49 and thereby ensure proper alignment between the electrical circuitry 50 on the printed circuit board like member 48 and the electrical conductors 34 on the connector member 32.

Unlike the alignment blade 20 shown in FIG. 1, however, the alignment block 46 of the present invention is configured to allow the printed circuit board like member 48 to be pivoted or rotated relative to the connector member 32 during insertion or withdrawal of the printed circuit board like member 48 into or from the opening 44 in the connector member 32 without creating torque forces that could break or otherwise damage the alignment block 46. As seen more clearly in FIG. 6, the alignment block 46 is provided with oppositely positioned end surfaces 52, 54 and oppositely positioned side surfaces 56, 58. Each of the side surfaces 56, 58 includes a generally flat side surface portion 60, 62, a generally concave shaped side surface portion 64, 66 and a generally convex shaped side surface portion 68, 70. In the illustrated embodiment, the end surfaces 52, 54 can be generally flat or straight.

Figure 6:
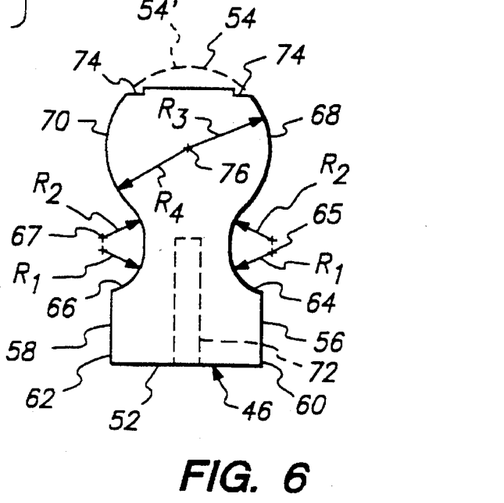
FIG. 6 is a plan view of the alignment block used in the connector assembly of the present invention.

The alignment block 46 is also provided with a generally centrally positioned hole 72. The hole 72 is adapted to receive a threaded screw or other type of fastener for allowing the alignment block 46 to be appropriately mounted on the connector member 32. That threaded screw or other type of fastener can also be used to mount the connector member 32 onto the main printed circuit board like member 36.

Each of the concave shaped side surface portions 64, 66 can be comprised of two curved segments having the same or substantially the same radius of curvature, but different centers of curvature. Thus, each of the concave shaped side surface portions 64, 66 can be defined by a first curved segment having a radius of curvature $R_1$ and a second curved segment having a radius of curvature $R_2$. Although the radii of curvature $R_1$, $R_2$ of the two curved segments defining each concave shaped side surface portion 64, 66 are equal or substantially equal, their centers of curvature are offset slightly as seen in FIG. 6.

It may be possible in some instances to form the concave shaped side surface portions 64, 66 such that each of the concave shaped side surface portions 64, 66 is defined by a single curved segment having a radius and a center of curvature. However, it has been found that such a construction may weaken the alignment block 46 since it may result in insufficient distance between the periphery of the hole 72 in the alignment block 46 and the concave shaped side surface portions 64, 66. By defining each of the concave shaped side surface portions 64, 66 as two curved segments having the same radius of curvature but different centers of curvature, additional space can be provided between the periphery of the hole 72 and the concave shaped side surface portions 64, 66. In that way, sufficient structural integrity can be imparted to the alignment block 46.

As further seen in FIG. 6, the convex shaped side surface portion 68 possesses a radius of curvature $R_3$ while the oppositely positioned convex shaped side surface portion 70 possesses a radius of curvature $R_4$. The radius of curvature $R_3$, $R_4$ of each of the convex shaped side surface portions 68, 70 is the same or substantially the same and both radii $R_3$, $R_4$ possess a common center of curvature. Once again, it is envisioned that the two convex shaped side surface portions 68, 70 could possess different radii of curvature and/or different centers of curvature, depending upon the requirements of a given situation.

Each of the concave shaped side surface portions 64, 66 provides a smooth transition or merger into the respective convex shaped side surface portion 68, 70. In that way, a smooth generally uninterrupted surface is provided which, as described in more detail below, facilitates rotation or pivoting movement of the printed circuit board like member 48 relative to the alignment block 46.

The end surface 54 of the alignment block 46 that faces into the slot 49 in the printed circuit board like member 48 can be provided with two undercut portions 74 as seen in FIG. 6. As will become more apparent from the description below, those undercuts 74 can also help facilitate relative rotational movement between the printed circuit board like member 48 and the alignment block 46.

Figure 8:
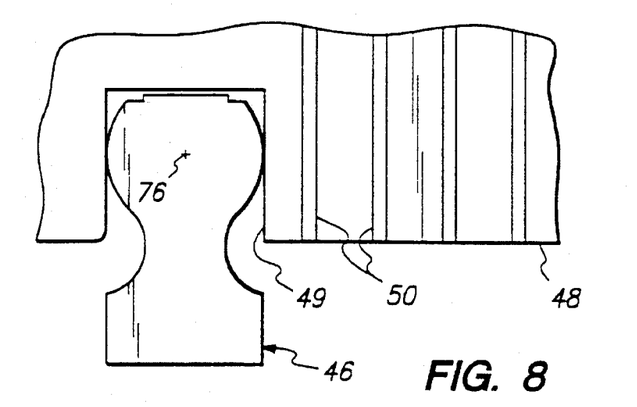
FIG. 8 is a plan view illustrating the alignment block of FIG. 6 as it is positioned within a slot in the printed circuit board like member shown in FIG. 7.
Figure 9:
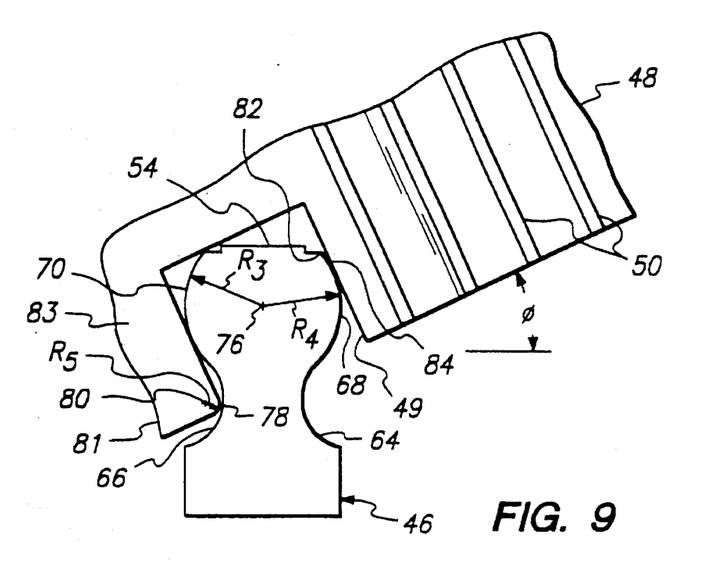
FIG. 9 is a plan view similar to FIG. 8 illustrating the way in which the printed circuit board like member can rotate or pivot without breaking or otherwise damaging the alignment block.

Having described the features associated with the connector member 32, and particularly the alignment block 46, reference is now made to FIGS. 8 and 9 for a description concerning how the alignment block 46 is able to avoid being damaged or broken during removal of a printed circuit board like member from the longitudinally extending opening 44 in the connector member 32. For purposes of simplicity and ease of understanding, FIGS. 8 and 9 only illustrate the alignment block 46 and the printed circuit board like member 48 that is to be inserted into the longitudinally extending opening 44 in the connector member 32. Although not illustrated, it is to be understood that the alignment block 46 is mounted at one end of the opening 44 in the connector member 32 and that the connector member 32 with the attached alignment block 46 is disposed on a printed circuit board like member 36 (i.e., a first printed circuit board like member) in the manner shown in FIG. 3. Those features have been omitted from FIGS. 8 and 9 to facilitate the illustration of how the alignment block 46 fits into and interacts with the slot 49 in the printed circuit board like member 48.

FIG. 8 illustrates the printed circuit board like member 48 (i.e., a second printed circuit board like member) as it is positioned within the longitudinally extending opening 44 in the connector member 32. In this position, the alignment block 46 mounted at the end of the opening 44 in the connector member 32 is positioned within the slot 49 in the printed circuit board like member 48. In the position illustrated in FIG. 8, the alignment block 46 aligns the printed circuit board like member 48 relative to the connector member 32 so that the electrical circuitry 50 on the printed circuit board like member 48 is aligned with and in electrical contact with the electrical conductors 34 on the connector member 32.

FIG. 9 illustrates the printed circuit board like member 48 after it has been rotated through an angle θ relative to the connector member 32 and the alignment block 46. During pivoting or rotational movement of the printed circuit board like member 48 from the position illustrated in FIG. 8 to the position illustrated in FIG. 9, the printed circuit board like member 48 rotates about an axis 76. The axis 76 about which the printed circuit board like member 48 rotates coincides with the center of curvature of the two convex shaped side surface portions 68, 70. The shape and configuration of the concave shaped side surface portions 64, 66 and the convex shaped side surface portions 68, 70 allow the printed circuit board like member 48 to freely rotate about the rotation axis 76 without creating torque forces that could break or otherwise damage the alignment block 46.

Continued rotation of the printed circuit board like member 48 about the axis 76 will eventually cause the corner 78 of the printed circuit board like member 48 to come into contact with the concave shaped side surface portion 66 as seen in FIG. 9. The angle θ at which the corner 78 of the printed circuit board like member 48 contacts the concave shaped side surface portion 66 can vary depending upon, for example, the dimensions of the alignment block 46 and the slot 49. However, by way of example, the angle θ at which the corner 78 of the printed circuit board like member 48 contacts the concave shaped surface portion 66 can be approximately 25°.

Once the corner 78 of the printed circuit board like member 48 contacts the concave shaped side surface portion 66 of the alignment block 46, further rotation or pivoting movement of the printed circuit board like member 48 relative to the connector member 32 and the alignment block 46 occurs about a second point or axis 80. That second pivot point or rotational axis 80 has a radius of curvature $R_5$ that is equal to or substantially equal to $R_1$. That second pivot point or rotational axis 80 is also located along a line that extends through the centers of curvature of the two curved segments having the radii of curvature $R_1$ (i.e., a line extending through the centers of curvature 65, 67 as seen in FIG. 6). Thus, the second pivot point or rotational axis 80 can coincide with the center of curvature 65 shown in FIG. 6.

Once the corner 78 of the printed circuit board like member 48 comes into contact with the concave shaped surface portion 66, continued rotation or pivoting movement of the printed circuit board like member 48 away from the connector member 32 causes the region 84 of the printed circuit board like member 48 to move away from the corner 82 of the alignment block 46. As that movement occurs, the printed circuit board like member 48 is freed from the alignment block 46, whereby the printed circuit board like member 48 is separated from the connector member 32.

Given the way in which the printed circuit board like member 48 rotates relative to the alignment block 46, it can be seen that the configuration of the end surface 54 on the alignment block 46 should be appropriately selected to prevent binding between the end surface 54 and the inner walls of the slot 49 in the printed circuit board like member 48. If the end surface 54 was defined by a continuation of the convex shaped side surface portions 68, 70 (i.e., see the dotted outline 54' illustrated in FIG. 6), the end surface 54 would contact the interior surfaces of the slot 49 in the printed circuit board like member 48 during rotation of the printed circuit board like member 48. As a result, binding would occur and torque would be applied to the alignment block 46, thereby possibly resulting in breakage or other damage to the alignment block 46.

By providing a flat end surface 54, it is possible to avoid that undesirable result. Although the preferred embodiment employs a flat end surface 54, it is to be understood that end surfaces having other configurations could also be used. For example, the end surface 54 could be slightly convex or slightly concave. In any event, the end surface 54 should preferably be shaped or configured such that all points along the end surface 54 are positioned at a distance from the axis of rotation 76 (i.e., the center of curvature for the convex curved side surface portions having radii $R_3$, $R_4$) that is less than the radii of curvature of the convex shaped side surface portions 68, 70. That is, the distance between the center of curvature/axis of rotation 76 and any point on the end surface 54 in a given place should be less than $R_3$ and $R_4$.

It is also to be noted that the undercut portions 74 on the end face 54 of the alignment block 46 also contribute to the prevention of binding while the printed circuit board like member 48 is rotating or pivoting relative to the connector member 32 and the alignment block 46.

Although the description set forth above with reference to FIGS. 8 and 9 describes the way in which the printed circuit board like member 48 rotates relative to the alignment block 46 during withdrawal of the printed circuit board like member 48 from the opening 44 in the connector member 32, it is to be understood that a similar description applies when the printed circuit board like member 48 is being inserted into the opening 44 in the connector member 32. That is, during insertion of the printed circuit board like member 48 into the opening 44 in the connector member 32, the printed circuit board like member 48 can be initially positioned in the manner illustrated in FIG. 9. Thereafter, the printed circuit board like member 48 is rotated into the positioned illustrated in FIG. 8.

To contrast, therefore, when the printed circuit board like member 48 is being removed from the opening 44 in the connector member 32, the printed circuit board like member 48 initially rotates or pivots about a first axis 76. Once the corner 78 of the printed circuit board like member 48 contacts the concave shaped side surface portion 66, the printed circuit board like member 48 pivots or rotates about a second axis 80 that is spaced from the first axis 76. On the other hand, when the printed circuit board like member 48 is being inserted into the opening 44 in the connector member 32, the rotation of the printed circuit board like member 48 occurs initially about the axis 80 and then shifts to the other axis 76 when the corner 78 of the printed circuit board like member 48 comes out of contact with the concave shaped side surface portion 66.

In both situations, the shape and configuration of the alignment block 46 inhibit creation of torque forces during pivoting or rotational movement of the printed circuit board like member 48 relative to the alignment block 46 and the connector member 32. Thus, it is much less likely that the alignment block 46 will become broken or otherwise damaged during such relative rotational movement.

With reference once again to FIG. 3, it is to be noted that another alignment block 46' is mounted at the opposite end of the opening 44 in the connector member 32. That alignment block 46' can be configured in substantially the same way as the alignment block 46 described above. However, the alignment block 46' need not function in substantially the same manner as the alignment block 46 described above.

As illustrated in FIG. 7, the end of the printed circuit board like member 48 opposite the slot 49 is provided with a cut-out region 84. The cut-out region 84 defines a side surface 86 that is adapted to be brought into engagement with the side surface of the alignment block 46' that faces the oppositely positioned alignment block 46. Thus, some amount of alignment is provided by the contact between the side surface 86 of the printed circuit board like member 48 and the side surface on the alignment block 46'. However, because the cut-out region 84 which receives that alignment block 46' is open on the side opposite the side surface 86, the alignment block 46' need not serve the same torque creation inhibiting function as the other alignment block 46.

To provide some examples of relative ratios of dimensions for the alignment block 46 and the slot 49 in the printed circuit board like member 48 that receives the alignment block 46, reference is made to FIG. 7. Assuming that the slot 49 in the printed circuit board like member 48 possesses a depth x and a width y, some suitable dimensions for the various parts of the alignment block 46 can be as follows. The perpendicular distance between the end face 54 and a line passing through the curved segments having a radius of curvature $R_2$ can be approximately x while the radius of curvature $R_3$, $R_4$ for each of the convex shaped side surface portions 68, 70 can be equal to or substantially equal to 0.5 y. Likewise, the perpendicular distance between the flat side surface portions 60, 62 can be equal to or approximately equal to y, while the radius of curvature $R_1$, $R_2$ for each of the curved segments of each concave shaped side surface portion 64, 66 can be approximately 0.25 y. Also, the distance between the centers of curvature for the two curved segments defining each concave shaped side surface portion 64, 66 (i.e., for each concave shaped side surface portion 64, 66, the distance between the center of curvature for the curved segment having radius $R_1$ and the center of curvature for the curved segment having radius $R_2$) can be approximately 0.08 y. Also, the perpendicular distance between the axis of rotation 76 and the end surface 54 can be approximately 0.33 y.

The foregoing relative ratios of dimensions of the various portions of the alignment block 46 and the slot 49 in the printed circuit board like member 48 are provided by way of example. Variations on those relative ratios can be employed depending upon the requirements of a particular system. Preferably, however, the shape, configuration and dimensions of the alignment block 46 relative to the slot 49 in the printed circuit board like member 48 should be selected to inhibit the creation of torque forces on the alignment block 46, and thereby prevent the alignment block 46 from becoming broken or otherwise damaged during such relative rotational movement.

Figure 10:
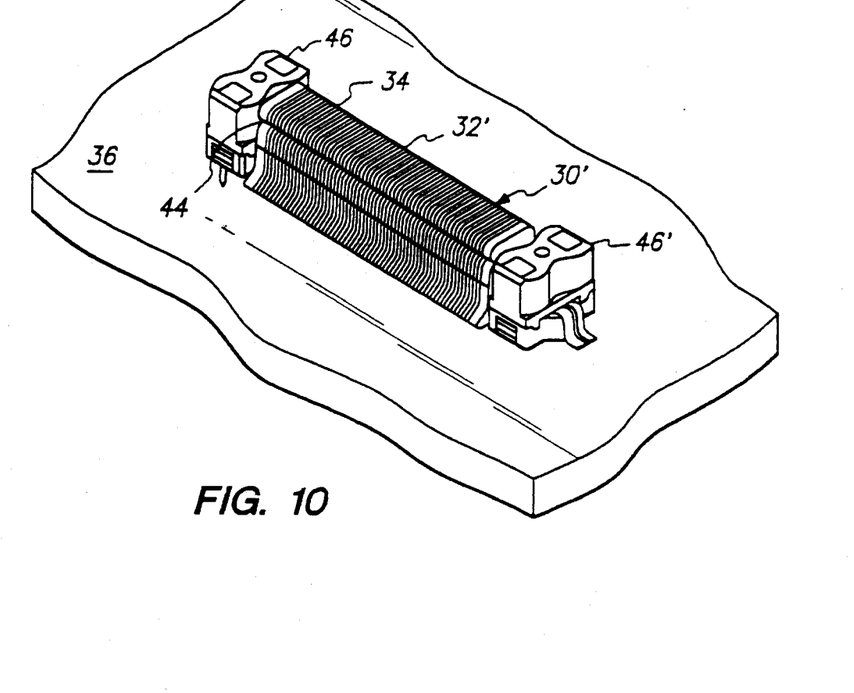
FIG. 10 is a perspective view similar to FIG. 3 illustrating an alternative orientation of the connector assembly.

With reference to FIG. 10, an alternative configuration and orientation of the connector assembly 30' is illustrated. The features of the connector assembly 30' shown in FIG. 10 which correspond to those shown in FIG. 3 are designated with like reference numerals.

The connector assembly 30' shown in FIG. 10 and its disposition on a printed circuit board like member 36 differs from that shown in FIG. 3 to the extent that the longitudinally extending opening 44 in the connector member 32' opens to the side rather than upwardly. Also, the alignment blocks 46, 46' are oriented differently to account for the way in which a plug-in printed circuit board like member is received in the opening 44. That is, the connector assembly 30' depicted in FIG. 10 is intended to receive a printed circuit board like member that is oriented generally parallel to the motherboard 36 while the connector assembly 30 shown in FIG. 3 is intended to receive a printed circuit board like member that is oriented generally perpendicular to motherboard 36. The alignment blocks 46, 46' associated with the connector assembly 30' depicted in FIG. 10 are oriented to allow a printed circuit board like member to be rotated during insertion into or withdrawal from the opening 44 in the connector assembly 30' in the same way described above.

Figure 11:
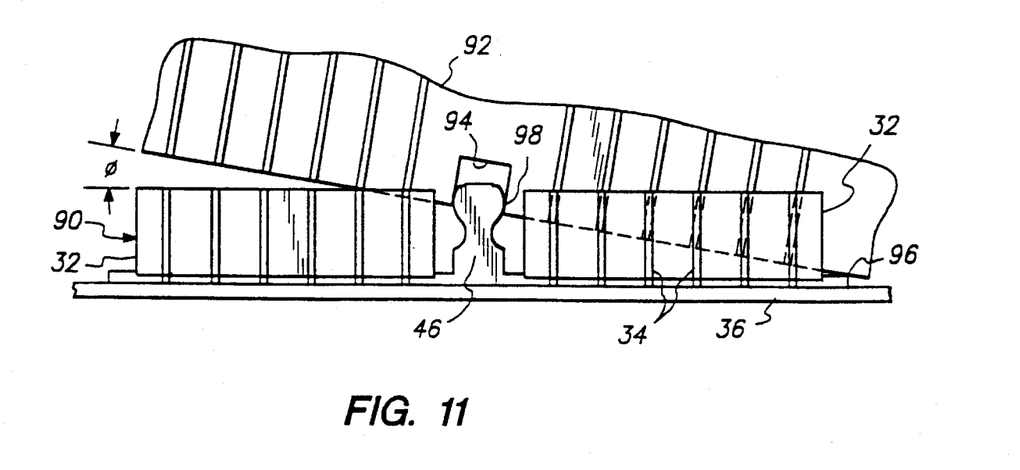
FIG. 11 is a plan view illustrating an alternative disposition of the alignment block on the connector assembly.

Turning to FIG. 11, an alternative embodiment of a connector assembly 90 is illustrated. The connector assembly 90 depicted in FIG. 11 is similar to the connector assembly 30 illustrated in FIG. 3 except that instead of being located at one of the ends of the connector assembly 90, the alignment block 46 is disposed intermediate the ends of the connector assembly 80. In the preferred embodiment shown in FIG. 11, the connector assembly 90 includes two spaced apart connector members 32 between which is positioned the alignment block 46. Thus, the alignment block 46 is positioned at one end of the opening 44 (not shown) which extends through each of the connector members 32. For purposes of description, the alignment block 46 is described as being positioned between two connector members 32. However, it is to be understood that the two connector members 32 could actually be a single connector member having an intermediately located cut-out region in which the alignment block 46 is disposed. The alignment block 46, illustrated in FIG. 11, is configured in the same manner as the alignment block 46 illustrated in FIG. 3 and described in detail above. Thus, a a detailed description of the alignment block features will not be included here.

Positioning the alignment block 46 intermediate the ends of the connector assembly 90 as illustrated in FIG. 11 can provide certain advantages with respect to the connector assembly illustrated in FIG. 3. When the printed circuit board like member 92 is inserted into or removed from the openings (not shown) in the connector members 32, the interaction between the alignment block 46 and the slot 94 in the printed circuit board like member 92 allows relative rotational movement between the printed circuit board like member 92 and the connector members 32 in the manner described above. As a result, it is much less likely that the alignment block 46 will break or otherwise become damaged during such rotational movement.

However, in the case of the embodiment of the connector assembly 90 shown in FIG. 11, the pivot point 96 about which the printed circuit board like member 92 rotates is positioned farther away from the alignment block 46 than in the case of the connector assembly 30 illustrated in FIG. 3. Since the pivot point 96 is positioned farther away from the alignment block 46, the angle θ at which the sides of the printed circuit board like member 92 clear the alignment block 46 is smaller than in the case of the embodiment of the connector assembly 30 shown in FIG. 3.

Positioning the alignment block 46 in an intermediate region of the connector assembly 90 is also advantageous from the standpoint of further preventing damage to the alignment block 46. As described above with reference to FIG. 9, when the alignment block 46 is positioned in the manner shown in FIG. 9, the rotation of the printed circuit like board member 48 relative to the alignment block 46 eventually causes the corner 78 of the printed circuit board like member 48 to contact the alignment block 46. Situations may arise, however, when rotation of the printed circuit board like member 48 in the foregoing manner could result in damage to the printed circuit board like member 48. For example, if the slot 49 in the printed circuit board like member 48 is positioned too close to the edge 81 of the printed circuit board like member 48, the flange 83 may be too thin or weak. Consequently, upon rotation of the printed circuit board like member 48, the contact between the alignment block 46 and the corner 78 of the printed circuit board like member 48 could result in breakage or damage to the flange 83 of the printed circuit board like member 48.

Such a possibility is significantly reduced when the alignment block 46 is positioned intermediate the ends of the connector assembly 90 in the manner illustrated in FIG. 11. That is, the angle θ at which the printed circuit board like member 92 moves away from the connector assembly 90 is much smaller as compared to the embodiment of the connector assembly 30 shown in FIG. 3. Consequently, the corner 98 of the printed circuit board like member 92 is not as likely to come into contact with the alignment block 46 and result in possible breakage or damage to the printed circuit board like member 92. Further, since the intermediate positioning of the alignment block 46 allows for a similar intermediate positioning of the slot 94 in the printed circuit board like member 92, the portion of the printed circuit board like member 92 adjacent the corner 98 can be made thicker or wider since it is not positioned adjacent the end of the printed circuit board like member.

Figure 12A:
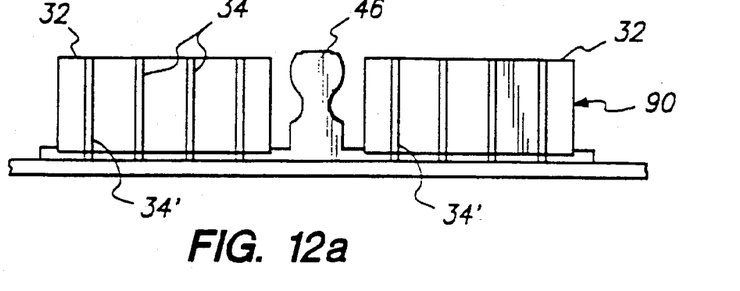
FIGS. 12(a)–12(d) are plan views of various alternative dispositions of the alignment block on the connector assembly for purposes of explaining advantages associated with certain alternatives.
Figure 12B:
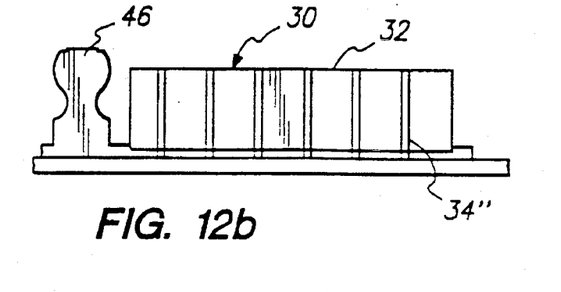

Another potential advantage associated with positioning the alignment block in the manner illustrated in FIG. 11 can be seen with reference to FIGS. 12(a) and 12(b). As has been mentioned above, the electrical conductors 34 on the connector members 32 are positioned at a specific predetermined position relative to the alignment block 46. Similarly, the electrical circuitry on the printed circuit board like member that is to be mounted on the connector members 32 is located at a specific predetermined position with respect to the slot (i.e., the slot that receives the alignment block) in the printed circuit board like member. In that way, when the printed circuit board like member is mounted on the connector assembly with the alignment block 46 positioned in the slot in the printed circuit board like member, the electrical conductors 34 on the connector members 32 will be aligned with the electrical circuitry on the printed circuit board like member.

By positioning the alignment block 46 intermediate to the ends of the connector assembly 90, better alignment capability of the electrical conductors 34 can be achieved. For example, as seen in FIG. 12(a), it is easier to properly position the farthermost electrical conductors 34' relative to the alignment block 46 when the alignment block 46 is positioned in the manner illustrated in FIG. 12(a) than it would be to position the farthermost electrical conductor 34" relative to the alignment block 46 when the alignment block 46 is positioned at the end of the connector assembly 30 as illustrated in FIG. 12(b). That is due at least in part to the fact that the farthermost connectors 34' in the FIG. 12(a) arrangement are located approximately one-half the distance from the alignment blade 46 as compared to the farthermost electrical conductor 34" in the FIG. 12(b) arrangement.

Figure 12C:
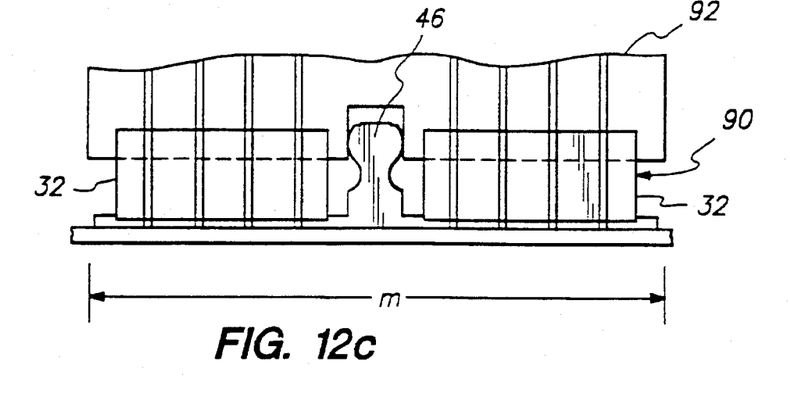
Figure 12D:
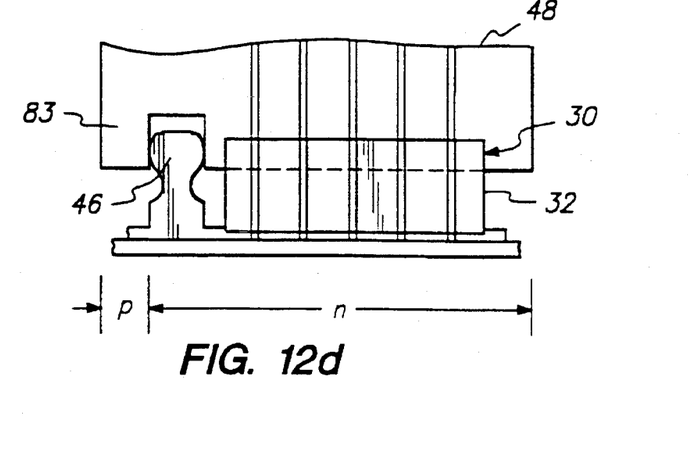

Another possible advantage associated with positioning the alignment block 46 intermediate to the ends of the connector assembly is that for a given number of electrical conductors spaced apart by a given pitch, the printed circuit board like member 92 can be made smaller than when the alignment block 46 is positioned at one end of the connector assembly. With reference to FIG. 12(d), when the alignment block 46 is positioned at the end of the connector assembly 30, the printed circuit board like member 48 must possess a width n for accommodating the necessary electrical conductors. In addition, the printed circuit board like member 48 must be provided with an additional width p to ensure that the flange 83 is sufficiently strong and not susceptible to breakage. On the other hand, when the alignment block 46 is positioned intermediate the ends of the connector assembly as shown in FIG. 12(c), that additional width p is not necessary since the portion of the printed circuit board like member 92 on which are mounted the electrical conductors provide the necessary strength and rigidity. Thus, an intermediate positioning of the alignment block as shown in FIG. 12(c) only requires a width m.

Figure 13:
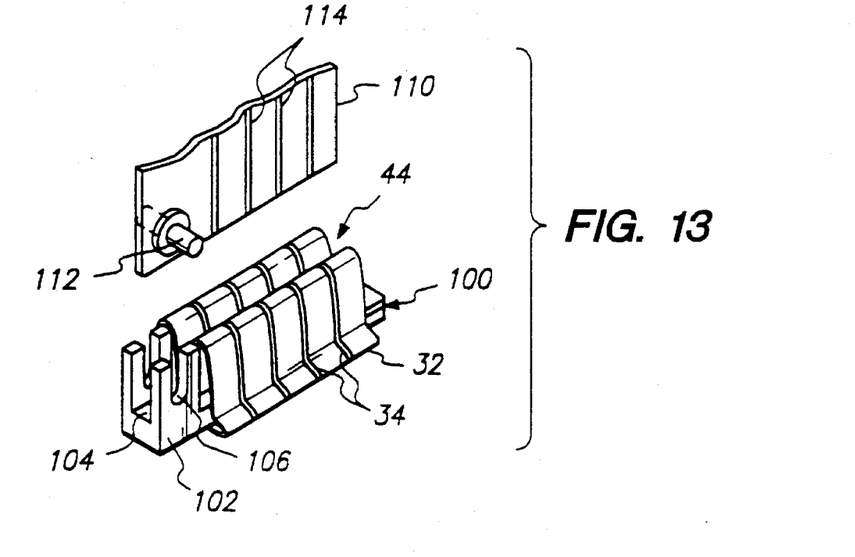
FIG. 13 is a perspective view of another alternative embodiment of the connector assembly and the printed circuit board like member for allowing relative rotational movement.

With reference to FIG. 13, another embodiment of an arrangement for allowing relative rotational movement between the printed circuit board like member and the connector assembly is illustrated. In this embodiment, the connector assembly 100 includes a connector member 32 similar to that described above with reference to the embodiment illustrated in FIG. 3. A portion of an alignment and rotation permitting feature is disposed at the end of the connector assembly 100. That alignment and rotation permitting feature includes an alignment block 102 that is provided with a longitudinally extending slot 104. The longitudinally extending slot 104 is generally aligned with the longitudinally extending opening 44 in the connector member 32. A transversely extending slot 106 is also provided in the alignment block 102. Due to the disposition of the longitudinally extending slot 104, the transversely extending slot 106 appears as though it is defined by two generally U-shaped grooves.

The printed circuit board like member 110 is provided with a cylindrically shaped pin 112 that also contributes to the alignment and rotation permitting feature. The pin 112 extends generally perpendicularly through the printed circuit board like member 110 and extends outwardly from the opposite facing surfaces of the printed circuit board like member 110.

When the printed circuit board like member 110 is inserted into the opening 44 in the connector member 32, the longitudinally extending slot 104 in the alignment block 102 receives a portion of the printed circuit board like member 110. Additionally, the pin 112 extending from the printed circuit board like member 110 is received in the transversely extending slot 106 in the alignment block 102. Preferably, the width across the transversely extending slot 106 is selected to be the same as or substantially the same as the diameter of the pin 112. In addition, the electrical conductors 34 on the connector member 32 are located in a specific predetermined position with respect to the transverse slot 106. Likewise, the electrical circuitry 114 on the printed circuit board like member 110 is located in a specific predetermined position with respect to the alignment pin 112. Consequently, when the alignment pin 112 is received in the slot 106, the electrical circuitry 114 on the printed circuit board like member 110 will be aligned with the electrical conductors 34 on the connector member 32.

It can also be seen that the combination of the alignment block 102 and the alignment pin 112 will allow the printed circuit board like member 110 to be rotated relative to the connector assembly 100 while avoiding damage to the printed circuit board like member 110 and the connector assembly 100.

Figure 14:
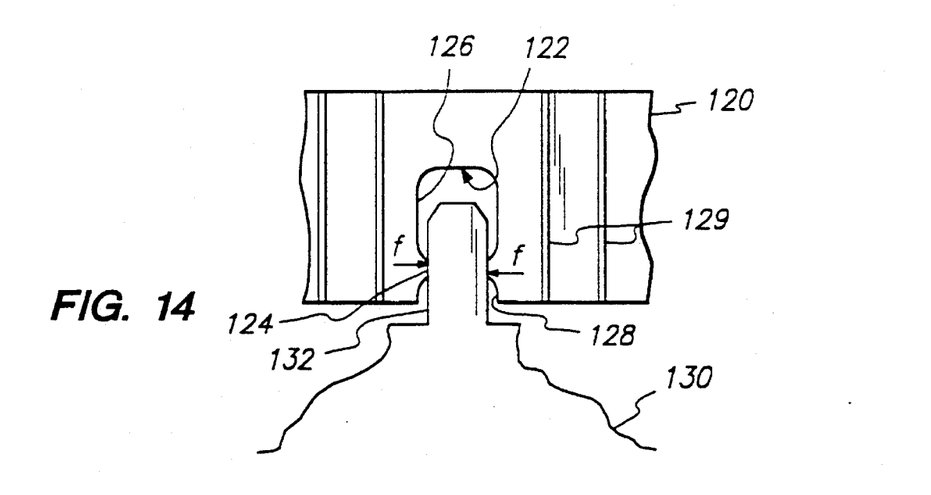
FIG. 14 is a plan view of a portion of a connector assembly and a printed circuit board like member illustrating another alternative embodiment for allowing relative rotational movement.

With reference to FIG. 14, another alternative arrangement is illustrated for allowing relative rotational movement between the printed circuit board like member and the connector assembly without breaking or otherwise damaging either element. As seen in FIG. 14, the printed circuit board like member 120 is provided with an alignment slot 122. The alignment slot 122 illustrated in FIG. 14 includes first, second and third slot portions 124, 126, 128. The first slot portion 124 defines an alignment slot portion. The third slot portion 128 which opens to the side edge of the printed circuit board like member 120 is larger in width or diameter than the adjacently located first slot portion 124. Similarly, the second slot portion 126 is enlarged relative to the first slot portion 124. The enlarged second and third slot portions 126, 128 can be produced in any suitable manner such as by routing.

The connector assembly 130 includes an alignment member or alignment block 132 that is to be received in the alignment slot 122 when the printed circuit board like member 120 is mounted on the connector assembly 130. It is to be understood that the other features associated with the connector member 132 (e.g., the flexible circuitry, the electrical conductors, etc.) are not illustrated in FIG. 14 for purposes of simplicity. Nevertheless, those other features as described above do form a part of the connector member 132.

As seen in FIG. 14, the width or diameter of the alignment member 132 is the same as or substantially the same as the width of the first slot portion 124. As described above with reference to the other embodiments, the electrical circuitry 129 on the printed circuit board like member 120 is located in a specific predetermined position with respect to the alignment slot 122. Likewise, the electrical conductors (not shown) on the connector assembly 130 are located in a specific predetermined position with respect to the alignment member 132. Consequently, when the alignment member 132 is closely received in the alignment slot portion 124 in the printed circuit board like member 120, the electrical conductors (not shown) on the connector assembly 130 will be aligned with the electric circuitry 129 on the printed circuit board like member 120.

Figure 15:
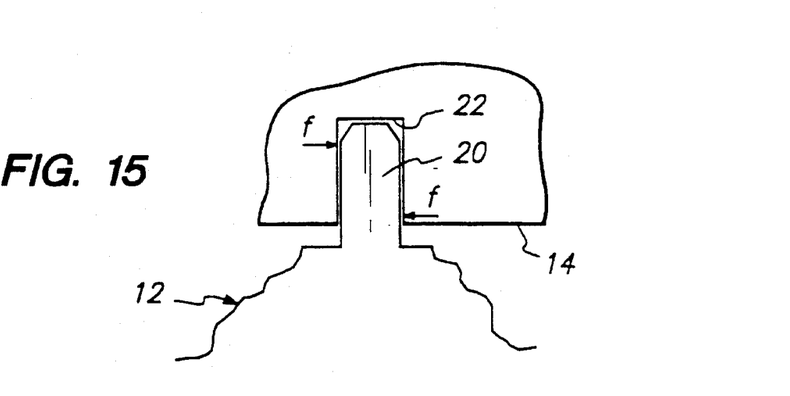
FIG. 15 is a plan view of a portion of the connector assembly and printed circuit board shown in FIGS. 1 and 2, illustrating the torque producing forces that result when relative rotational movement occurs.

The presence of the enlarged second and third slot portions 126, 128 in combination with the relatively short longitudinal extent of the alignment slot portion 124 reduces the possibility that breakage or damage will occur to the alignment member 132 when the printed circuit board like member 120 is rotated relative to the connector assembly 130. The reason for this can be more easily understood with reference to FIG. 15 which generally depicts the arrangement shown in FIGS. 1 and 2 in which the alignment blade 20 is received in the slot 22 in the printed circuit board like member 14. When relative rotation of the printed circuit board like member 14 and the connector assembly 12 occurs, a torque producing force is imparted to the alignment blade 20. That torque producing force results from the application of two forces f as seen in FIG. 15. As can be readily appreciated, the greater the distance between the two torque producing forces f, the greater the torque and the more likely the alignment blade 20 will become broken or otherwise damaged.

In the case of the embodiment of the present invention illustrated in FIG. 14, relative rotational movement between the printed circuit board like member 120 and the connector assembly 130 also results in the application of torque producing forces f. However, the perpendicular distance between those two torque producing forces f is significantly less than the corresponding distance between the torque producing forces f in the arrangement illustrated in FIG. 15. That is due, at least in part, to the relatively short longitudinal extent of the alignment slot portion 124 as well as the disposition of enlarged slot portions 126, 128 on either side of the first slot portion 124. Since the perpendicular distance between the torque producing forces f is significantly less than in the case of the arrangement depicted in FIG. 15, it is much less likely that rotational movement between the printed circuit board like member 120 and the connector assembly 130 will result in breakage or damage to the connector member 132.

Although the printed circuit board like member 120 is depicted as having an alignment slot 122 that is configured in the manner illustrated in FIG. 14, it is understood that other alternative arrangements are possible. For example, the second slot portion 126 could be much more rounded and circular in nature rather than having generally straight sides. Also, the third slot portion 128 could be defined by straight sides that taper in a narrowing manner towards the first slot portion 124. If the longitudinal extent of the alignment slot portion 124 of the slot 122 is made sufficiently small, it may be possible to eliminate the enlarged third slot portion 128 and thereby allow the alignment slot portion 124 to extend to the side edge of the printed circuit board like member 120.

The principles, preferred embodiments and modes of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims be embraced thereby.

What is claimed is:

1. A connector assembly for electrically interconnecting two printed circuit board like members, comprising a connector member for being mounted on a first printed circuit board like member, said connector member including generally parallel-spaced electrical conductors for being electrically connected to electrical circuitry on the first printed circuit board like member, said connector member having an opening extending along the length thereof for receiving a second printed circuit board like member, said electrical conductors being positioned along at least one side of the opening, said connector member having an alignment block located at one end of the opening for being received in a slot provided in the second printed circuit board like member and for aligning electrical circuitry on the second printed circuit board like member with the electrical conductors that are positioned on the at least one side of the opening upon insertion of the second printed circuit board like member into the opening, said alignment block having oppositely positioned curved side surface portions and an end surface extending between the curved side surface portions for allowing the second printed circuit board like member to rotate relative to the connector assembly without breaking the alignment block during insertion and withdrawal of the second printed circuit board like member into and from the opening, said curved side surface portions each having a radius of curvature measured from a center of curvature, the perpendicular distance from the center of curvature of each curved side surface portion to the end surface being less than the radius of curvature of each side surface portion.

2. The connector assembly according to claim 1, wherein said end surface is flat.

3. The connector assembly according to claim 1, wherein each of said two curved side surface portions is a convex curved side surface portion, each of said convex curved side surface portions being positioned between the end surface and a concave side surface portion.

4. The connector assembly according to claim 1, wherein said connector member includes a biasing element having flexible circuitry mounted thereon, said electrical conductors being disposed on said flexible circuitry.

5. The connector assembly according to claim 1, wherein the electrical conductors are disposed on both sides of the opening, and the center of curvature of one of said curved side surface portions coincides with the center of curvature of the other of said curved side surface portions.

6. The connector assembly according to claim 1, including two spaced apart connector members which each have generally parallel-spaced electrical conductors for being electrically connected to electrical circuitry on the first printed circuit board like member and an opening extending along the length thereof for receiving a second printed circuit board like member, said alignment block being positioned between the two connector members.

7. A connector assembly for electrically interconnecting two printed circuit board like members, comprising a connector member for being mounted on a first printed circuit board like member, said connector member including spaced-generally parallel electrical conductors for being electrically connected to electrical circuitry on the first printed circuit board like member when the connector member is mounted on the first printed circuit board like member, said electrical conductors being positioned on at least one side of a longitudinal opening that extends along a longitudinal extent of the connector member for receiving a second printed circuit board like member having electrical circuitry thereon, said longitudinal opening being positioned in a first plane, alignment means associated with the connector member for aligning the electrical contacts on the at least one side of the opening with the electrical circuitry on the second printed circuit board like member when the second printed circuit board like member is inserted into the opening, and rotation allowing means for allowing the second printed circuit board like member to be rotated relative to the connector member in the first plane during removal of the second printed circuit board like member from the opening in the connector member without breaking or otherwise damaging the alignment means, said rotation allowing means permitting said second printed circuit board like member to be rotated in the first plane relative to the connector member without breaking or otherwise damaging the alignment means until the second printed circuit board like member is completely removed from the opening in the connector member.

8. The connector assembly according to claim 7, wherein said alignment means includes an alignment block located at one end of the opening in the connector member, and wherein said rotation allowing means includes oppositely positioned convex curved side surface portions on the alignment block.

9. The connector assembly according to claim 8, wherein said convex curved side surface portions have substantially the same radius of curvature and substantially the same center of curvature.

10. The connector assembly according to claim 8, wherein said rotation allowing means also includes an end surface on said alignment block positioned between said two convex curved side surface portions, said end surface being positioned radially inwardly of an imaginary continuation of said two convex curved side surface portions.

11. The connector assembly according to claim 8, wherein said rotation allowing means also includes an end surface on said alignment block that extends between said two convex curved side surface portions, each of said convex curved side surface portions having a radius of curvature measured from a center of curvature, the perpendicular distance from the center of curvature of each convex curved side surface portion to the end surface being less than the radius of curvature of the respective convex curved side surface portion.

12. The connector assembly according to claim 8, wherein said alignment block includes oppositely positioned concave curved side surface portions, each of said concave curved side surface portions smoothly merging into one of the convex curved side surface portions.

13. The connector assembly according to claim 7, including two spaced apart connector members each having generally parallel-spaced electrical conductors for being electrically connected to electrical circuitry on the first printed circuit board like member and an opening extending along the length thereof for receiving a second printed circuit board like member, said alignment means including an alignment block positioned between said two spaced apart connector members, said rotation allowing means including oppositely positioned curved side surface portions formed on the alignment block.

14. The connector assembly according to claim 13, wherein said curved side surface portions include oppositely positioned convex curved side surface portions, said alignment block having an end surface and concave curved side surface portions, each of said convex curved side surface portions being located between said end surface and one of said concave curved side surface portions.

15. The connector assembly according to claim 7, wherein said alignment means includes an alignment block provided on the connector member, said alignment block having a generally longitudinally extending slot aligned with the opening in the connector member for receiving a second printed circuit board like member, said alignment block also including a transversely extending slot which extends transverse to the longitudinally extending slot for receiving an alignment pin extending from the second printed circuit board like member.

16. The connector assembly according to claim 7, wherein said alignment means includes an alignment block for being received in a slot formed in the second printed circuit board like member when the second printed circuit board like member is inserted into the opening in the connector assembly.

17. The connector assembly according to claim 16, wherein said rotation allowing means includes two curved surfaces formed on opposite sides of the alignment block.

18. A printed circuit board like system for being electrically interconnected to a first printed circuit board like member, comprising:

a second printed circuit board like member having electrical circuitry thereon;

a connector member for being mounted on a first printed circuit board like member, said connector member including spaced-generally parallel electrical conductors for being electrically connected to electrical circuitry on the first printed circuit board like member when the connector member is mounted on the first printed circuit board like member, said electrical conductors being positioned on at least one side of an opening that extends along a longitudinal extent of the connector member for receiving the second printed circuit board like member, said opening being positioned in a first plane;

alignment means for aligning the electrical conductors on the at least one side of the opening with electrical circuitry on the second printed circuit board like member when the second printed circuit board like member is inserted into the opening in the connector member;

rotation permitting means for permitting the second printed circuit board like member to be rotated relative to the connector member in the first plane during insertion and withdrawal of the second printed circuit board like member into and from the opening in the connector member without creating torque forces sufficient to break the alignment means.

19. The system according to claim 18, wherein said alignment means includes an alignment element extending from the connector member and a slot formed in the second printed circuit board like member for receiving the alignment element, said slot including a first slot portion whose width is substantially equal to a thickness of the alignment element, said slot including a second slot portion whose width is greater than the width of the first slot portion so that a portion of the alignment element can move within the second slot portion, said rotation permitting means including said second slot portion.

20. The system according to claim 19, wherein said rotation permitting means also includes a third slot portion extending from an open end of the slot to the first slot portion, said third slot portion having a width that is greater than the width of the first slot portion.

21. The system according to claim 18, wherein said alignment means includes an alignment block provided on the connector member, a first slot formed in the alignment block, and a pin extending from the second printed circuit board like member and receivable in the slot.

22. The system according to claim 21, wherein said rotation permitting means includes said pin being rotatably disposed within said slot.

23. The system according to claim 21, wherein said alignment block includes a second slot that is aligned with the longitudinally extending opening in the connector member and that receives a portion of the second printed circuit board like member when the second printed circuit board like member is inserted into the opening.

24. The system according to claim 18, wherein the alignment means includes an alignment block positionable in a slot in the second printed circuit board like member when the second printed circuit board like member is inserted into the opening in the connector member.

* * * * *